US009053780B2

(12) United States Patent
Hsu et al.

(10) Patent No.: US 9,053,780 B2
(45) Date of Patent: Jun. 9, 2015

(54) MEASURING ELECTRICAL RESISTANCE

(71) Applicant: TAIWAN SEMICONDUCTOR MANFACTURING COMPANY, LTD., Hsinchu (TW)

(72) Inventors: Kuoyuan Hsu, San Jose, CA (US); Po-Hung Chen, Taipei (TW); Jiann-Tseng Huang, Hsinchu (TW); Subramani Kengeri, San Jose, CA (US)

(73) Assignee: TAIWAN SEMICONDUCTOR MANFACTURING COMPANY, LTD. (TW)

( * ) Notice: Subject to any disclaimer, the term of this patent is extended or adjusted under 35 U.S.C. 154(b) by 0 days.

(21) Appl. No.: 13/854,218

(22) Filed: Apr. 1, 2013

(65) Prior Publication Data

US 2013/0223129 A1    Aug. 29, 2013

Related U.S. Application Data

(62) Division of application No. 12/824,652, filed on Jun. 28, 2010, now Pat. No. 8,432,759.

(60) Provisional application No. 61/221,842, filed on Jun. 30, 2009.

(51) Int. Cl.
| | |
|---|---|
| *G11C 7/00* | (2006.01) |
| *G11C 7/06* | (2006.01) |
| *G11C 13/00* | (2006.01) |
| *G11C 17/16* | (2006.01) |
| *G11C 17/18* | (2006.01) |
| *G11C 7/22* | (2006.01) |
| *G11C 5/14* | (2006.01) |
| *G11C 16/26* | (2006.01) |

(52) U.S. Cl.
CPC ............ *G11C 13/00* (2013.01); *G11C 13/0004* (2013.01); *G11C 5/147* (2013.01); *G11C 13/004* (2013.01); *G11C 7/062* (2013.01); *G11C 7/00* (2013.01); *G11C 16/26* (2013.01); *G11C 17/16* (2013.01); *G11C 17/165* (2013.01); *G11C 17/18* (2013.01); *G11C 2013/0045* (2013.01); *G11C 7/22* (2013.01)

(58) Field of Classification Search
CPC .......... G11C 5/147; G11C 7/00; G11C 7/062; G11C 13/004; G11C 13/0004; G11C 16/26
USPC ................. 365/148, 163, 201, 225.7, 189.15, 365/189.09
See application file for complete search history.

(56) References Cited

U.S. PATENT DOCUMENTS

| | | | | |
|---|---|---|---|---|
| 5,995,422 A | * | 11/1999 | Im et al. ........................ | 365/200 |
| 7,224,633 B1 | * | 5/2007 | Hovis et al. ................. | 365/225.7 |

(Continued)

FOREIGN PATENT DOCUMENTS

CN          1696715          11/2005

OTHER PUBLICATIONS

Office Action from corresponding application No. CN 201010221425.7.

*Primary Examiner* — Ly D Pham
(74) *Attorney, Agent, or Firm* — Lowe Hauptman & Ham, LLP

(57) ABSTRACT

In at least one embodiment, a method includes applying an input voltage external to a semiconductor chip to a first circuit of the semiconductor chip to generate an output voltage external to the semiconductor chip. The first circuit is electrically coupled to a resistive device. A logic state of the resistive device is determined based on a logic state of the external output voltage.

21 Claims, 4 Drawing Sheets

(56) References Cited

U.S. PATENT DOCUMENTS

| | | |
|---|---|---|
| 7,345,904 B1 | 3/2008 | Park et al. |
| 7,376,036 B2 * | 5/2008 | Ueda .......................... 365/225.7 |
| 2009/0067215 A1 * | 3/2009 | Muraoka et al. .............. 365/148 |
| 2010/0002490 A1 * | 1/2010 | Mitani et al. .................. 365/148 |
| 2010/0067319 A1 | 3/2010 | Aipperspach et al. |
| 2010/0232248 A1 | 9/2010 | Erickson et al. |

* cited by examiner

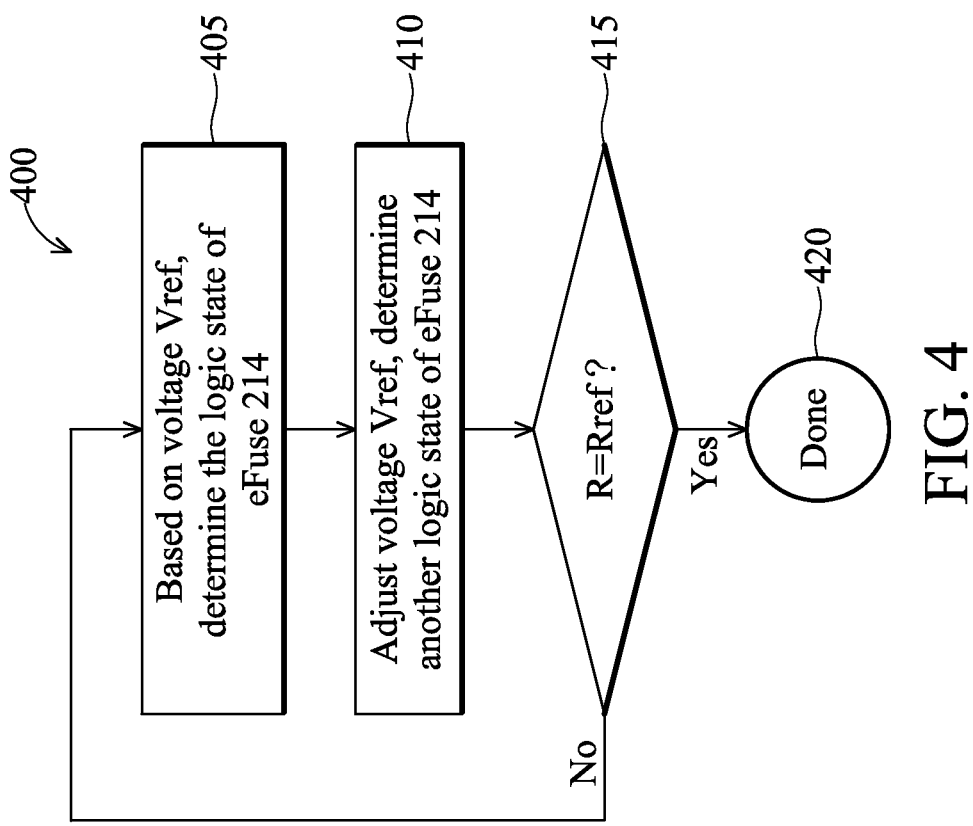

MEASURING ELECTRICAL RESISTANCE

CROSS-REFERENCE TO RELATED APPLICATIONS

The present application is a divisional application of U.S. patent application Ser. No. 12/824,652, filed Jun. 28, 2010, which claims priority of U.S. Provisional Patent Application Ser. No. 61/221,842, filed on Jun. 30, 2009, each of which are incorporated herein by reference in their entirety.

TECHNICAL FIELD

The present disclosure is related to resistance. Various embodiments provide mechanisms to precisely and efficiently measure eFuse (electrical fuse) resistance and thus overcome limitations of approaches that use testers for such measurements.

BACKGROUND

Currently, acquiring precise eFuse resistance is inefficient, especially for huge volume analysis. Generally, approaches using testers force a voltage, measure the current, and then calculate the resistance from the current and voltage. For memory arrays, various approaches measure the eFuse resistance of the memory cells bit by bit (e.g., cell by cell), and require connection time between a tester and the memory array for each bit. Approaches using a parameter measurement unit (PMU) can require setup and stabilization time. For example, some approaches, including connection, setup and stabilization time, etc., take about 220 ms to measure resistance of an eFuse in a memory cell or about 15 minutes for a memory array of 4k cells, making it inefficient to collect high volume data for statistical analysis. This can affect reliability and quality in eFuse development. Further, during different measurements eFuse resistance can shift, resulting in inaccurate measurements. Additionally, some column selects of PMOS resistance of the memory array with high current can force a programming device for the eFuse into saturation mode, also resulting in inaccurate measurements.

BRIEF DESCRIPTION OF THE DRAWINGS

The details of one or more embodiments of the disclosure are set forth in the accompanying drawings and the description below. Other features and advantages of the disclosure will be apparent from the description, drawings, and claims.

FIG. 4 is a flow chart illustrating a method for measuring a resistance value of an eFuse in the circuit of FIG. 2.

Like reference symbols in the various drawings indicate like elements.

DETAILED DESCRIPTION

Figure 1:
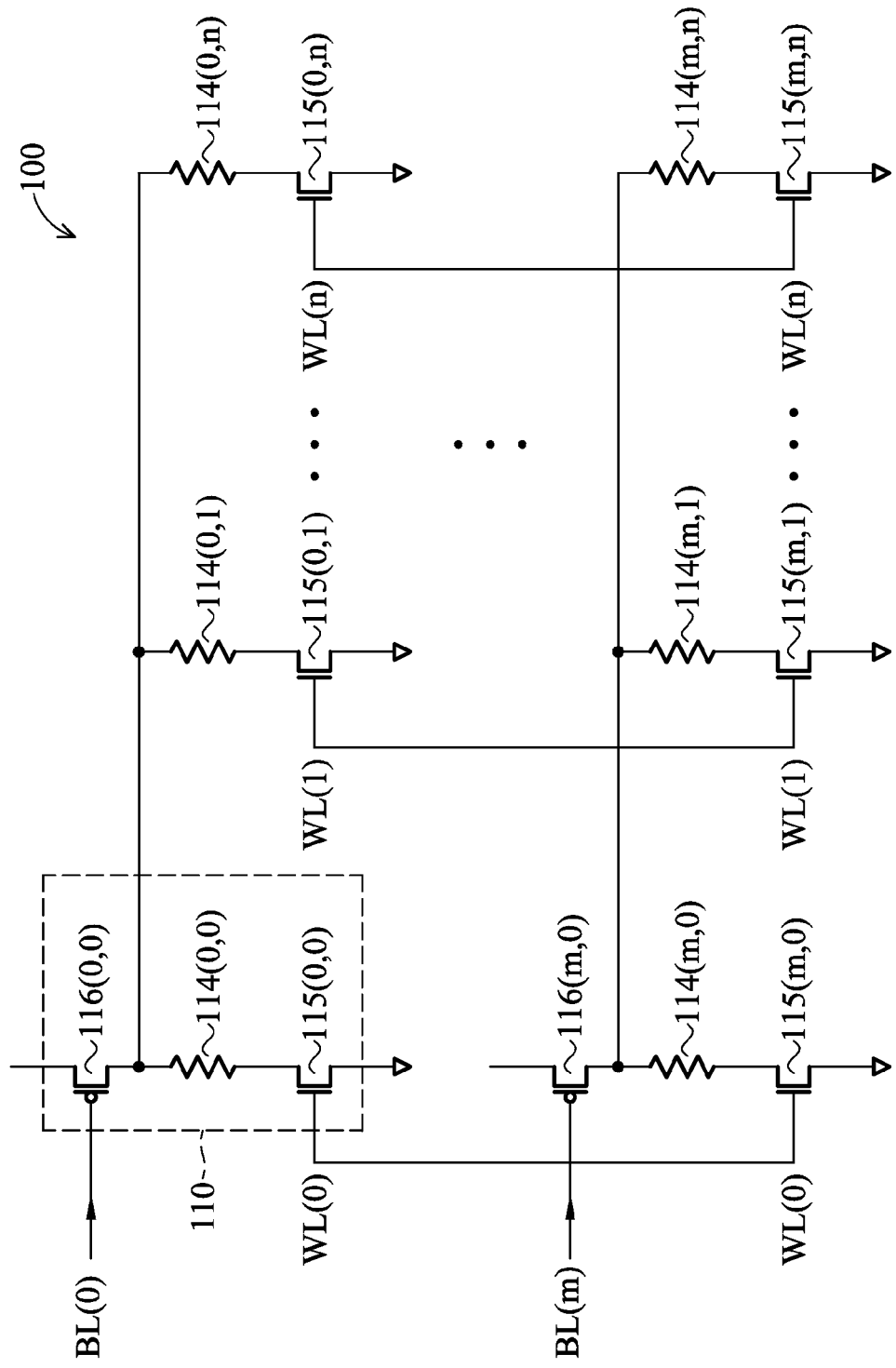
FIG. 1 shows an exemplary memory array that can benefit from embodiments of the disclosure.

Embodiments, or examples, of the disclosure illustrated in the drawings are described using specific language. It will nevertheless be understood that no limitation of the scope of the invention is thereby intended. Any alterations and modifications in the described embodiments, and any further applications of principles of the disclosure described in this document are contemplated as would normally occur to one skilled in the art to which the disclosure relates. Reference numbers may be repeated throughout the embodiments, but this does not necessarily require that feature(s) of one embodiment apply to another embodiment, even if they share the same reference number.

The Memory Array

FIG. 1 shows a memory array 100 that can benefit from various embodiments of the disclosure. For illustration purposes, memory array 100 includes m bit lines BL and n word lines WL. Each bit line BL is associated with a bit line select transistor 116 and a plurality of n memory cells each of which includes an eFuse 114 and a programming device (e.g., transistor) 115. A bit line BL controls bit line select transistor 116. When bit line BL is activated (e.g., driven with a high logic (High)) it turns on transistor 116, and when it is de-activated (e.g., drive with a low logic (Low)), it turns off transistor 116. A word line WL controls (e.g., turning on or off) a corresponding programming transistor 115. Circuit 110 including transistor 116(0,0), eFuse 114(0,0) and transistor 115(0,0), for illustration purposes, are explained in conjunction with FIG. 2 below.

An eFuse 114 generally includes two logic states, e.g., a low and a high. In an embodiment, the eFuse 114 is Low when its resistance is Low and is High when its resistance is High. For illustration purposes, the resistance of an eFuse 114 may be referred to as R, and in an embodiment, is about 200 Ohm for a low and about 10K Ohm for a high. Transistors 115 may be referred to as selectors or programming transistors. To access an eFuse 114 (e.g., eFuse 114(0,0) a corresponding bit line BL (e.g., BL(0)) and word line WL (e.g., WL(0)) are activated, which in turn activate the corresponding transistors 116(0,0) and 115(0,0).

Exemplary Features of Various Embodiments

Various embodiments of the disclosure provide mechanisms to efficiently and precisely measure resistance of eFuse 114. For example, in an embodiment, the circuit to measure the eFuse 114 (e.g., circuit 200 in FIG. 2 as discussed below) is embedded in a same semiconductor chip embodying the memory array (e.g., memory array 100), and therefore provides efficient measurements because the long-time communication and/or connection with an external source (e.g., a tester) for such measurement can be avoided. In an application, measuring eFuse resistance of cells in the memory array (e.g., array 100) can be done by appropriately toggling the address (e.g., selecting the bit lines BL and word lines WL) of each cell, resulting in efficient (e.g., fast) measurements. Further, measuring resistance of an eFuse 114 of a memory cell takes about 50 ns, which is much faster than 220 ms required in other approaches. As acquiring eFuse resistance in accordance with embodiments of the disclosure can be done in a short time, volume of resistance data (e.g., for the whole wafer and/or batch of wafers) can be collected and thus greatly benefit designers in electrical characterization analysis. For another example, volume of resistance data for pre-baked and post-baked tests can be collected, and shifts in eFuse resistance from different tests can be identified and analyzed. Additional benefits from the ability to collect huge volume of resistance data in accordance with some embodiments of the disclosure include, for example, margin checks, screen functions, quality enhancement, etc.

Circuit Embodiment to Measure eFuse Resistance

Figure 2:
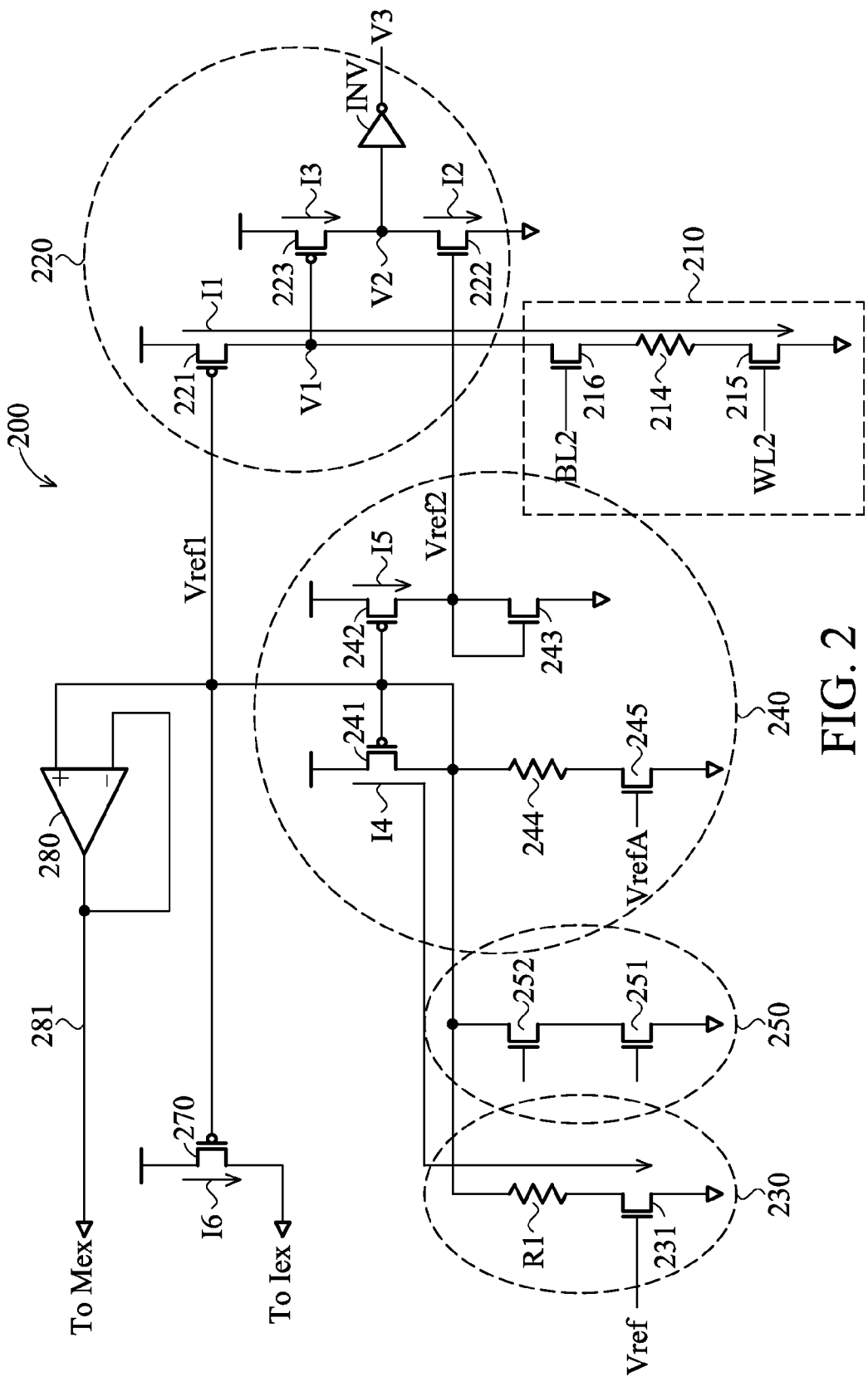
FIG. 2 shows a circuit embodiment of the disclosure.

FIG. 2 shows a circuit 200 used to measure eFuse resistance in accordance with an embodiment of the disclosure.

For illustration purposes, circuit 200 includes circuit 210 that corresponds to circuit 110 in FIG. 1.

Circuit 230 receives the input reference voltage Vref from which voltages Vref1 and Vref2 are generated. When voltage Vref activates transistor 231, it generates current I4 flowing through transistor 241, resistor R1 and transistor 231, which also generates Vref1 at the drain and the gate of transistor 241. Those skilled in the art will recognize that because transistor 231 is an NMOS, current I4 is proportional to voltage Vref.

In an embodiment, a reference resistance, e.g., resistance Rref, is generated from voltage Vref. Once voltage Vref1 is generated Op Amp 280 buffers this voltage Vref1 to line 281 so that a voltage measurement device (e.g., voltage meter Mex) external to the chip embodying circuit 200 can measure this voltage Vref1. Further, because current I4 is mirrored to current I6 through transistor 270, the drain of transistor 270 is coupled to a current meter (e.g., current meter Iex) external to the chip embodying circuit 200 so that this current meter Iex can measure this current I6 or in fact, current I4. In an embodiment, the external current meter Iex is provided with a voltage having the same value as Vref1 to provide a better mirror of current I6 from current I4. This is because, for a better current mirror, it is desirable that the voltage at the drain of transistor 270 (e.g., voltage Vex) be similar to the voltage at the drain of transistor 241, which is Vref1. Because Rref=Vex/I6 and Vex=Vref1, Rref=Vref1/I6. As explained above, voltage Vref1 is known through voltage meter Mex and current I6 (or I4) is known through current meter Iex, Rref can be calculated. In an embodiment, a tester provides both voltage meter Mex and current meter Iex.

Those skilled in the art will recognize that different values of Vref provide different values of Vref1 and thus different values of Rref. Further, varying one or a combination of the value of resistor R1 and the size of transistor 231 varies the value of current I4. As a result, varying one or a combination of voltage Vref, the size of transistor 231 and the value of resistor R1 varies Rref. For illustration purposes a circuit including a resistor R1 and transistor 231 may be referred to as a current branch. Depending on applications and design choices circuit 200 may include various current branches so that different ranges of Rref may be selected. Depending on the desired values of resistance Rref, one or a combination of different current branches may be selected so that the desired resistance Rref may be generated. For example, branches BR1, BR2, BR3 (not shown) provide currents 5 nA, 15 nA, and 25 nA respectively. To have a reference resistance Rref corresponding to 20 nA, branches BR1 and BR2 may be selected. For a reference resistance Rref corresponding to 30 nA, branches BR1 and BR3 may be selected, and for a reference resistance corresponding to 40 nA, branches BR2 and BR3 may be selected, etc. Further, depending on design choices, a resistor (e.g., resistor R1) may or may not be included in a current branch. Alternatively, a resistive circuit (e.g., transistor) may replace the resistor R1. The value of a current branch (e.g., 5 nA, 15 nA, 25 nA, etc.) is a design choice and, depending of implementations, depends on the size of the transistor and the value of the resistor constituting the current branches, etc. The above exemplary current branch is for illustration only, various other mechanisms to generate a current branch are within the scope of embodiments of the disclosure.

Because the value of the reference voltage Vref can be easily modified (e.g., varied), the value of Rref can be easily varied, providing flexibility in using circuit 200. For example, in an application, the resistance of eFuse 214 can shift after a temperature bake test. By changing the value of resistance Rref, in conjunction with circuit 200, the value of eFuse resistance can be easily obtained from the pre- and post-baked tests, the shift of such eFuse resistance from test to test can be easily identified. Depending on applications and design choices, voltage Vref may be varied linearly, setup in a binary search algorithm, or any other convenient techniques. Alternatively, resistance Rref may be varied (e.g., in a linear, a binary search or any other pattern) from which voltage Vref may be input, and the value of eFuse resistance R may be determined and/or measured accordingly.

Sense amplifier bias circuit 240 provides currents I4 and I5 and voltages Vref1 and Vref2. Current I4 is generated when voltage Vref turns on transistor 231 allowing current I4 flowing through PMOS transistor 241, resistor R1, and transistor 231. Current I4 is mirrored to current I5 via PMOS transistor 242 and NMOS transistor 243. Because transistors 242 and 243 serve as a current mirror of current I4 to current I5, once current I4 is generated current I5 is mirrored (e.g., generated), and voltage Vref2 is also generated. Current I4 is also mirrored to current I1 via PMOS transistor 221. In an embodiment, resistor 244 and transistor 245 serve to provide a reference voltage, e.g., voltage VrefA. Via calculations, a reference resistance, e.g., resistance RrefA (not shown), is calculated from voltage VrefA and is used as a reference resistance for circuit 200 (e.g., similar to resistance Rref). That is, resistance R of eFuse 214 may be determined high or low through sensing circuit 220 with respect to this reference resistance RrefA.

Circuit 210 includes an eFuse 214, the resistance of which, e.g., R, is to be measured. EFuse 214 could be any eFuse 114 of memory array 100 or various other resistors or resistive devices that can benefit from embodiments of the disclosure. Bit line BL2 and word line WL2 correspond a bit line BL and a word line WL of memory array 100. For illustration purposes, FIG. 2 shows only one eFuse 214, but embodiments of the disclosure can be used to measure resistance of more than one eFuse (e.g., eFuses for the whole memory array 100). When transistor 221 is on current I1 flows from transistor 221 through transistor 216, eFuse 214 and transistor 215. In an embodiment because Vds 216 (not shown), the voltage across the drain and the source of transistor 216, is insignificant as compared to voltage V1, V1=R×I1. Because current I1 is a current mirror of current I4 V1=R×I4 or R=V1/I4.

Sensing circuit 220 detects the logic states of eFuse 214, e.g., determining whether it is low or high. Voltage Vref1 at the gate of transistor 221 controls PMOS transistor 221 while voltage Vref2 at the gate of transistor 222 controls NMOS transistor 222. As a result, Vref1 generates current I1 while Vref2 generates current I2. As discussed above, current I1 is a current mirrored from current I4 through transistor 221, and current I2 is a current mirrored from current I5. Because I5=I4, I2=I4. Generally, current I2 is constant with respect to voltage Vref2.

Voltage V1 at the drain of transistor 221 and the gate of transistor 223 controls PMOS transistor 223 and thus generates current I3. Because transistor 223 is a PMOS, voltage V1 is inversely proportionate to current I3. That is, if V1 increases, current I3 decreases, and if V1 decreases, I3 increases. Because R=V1/I4 and Rref=Vref1/I4, then if R=Rref then V1=Vref. As a result, if R<Rref then V1<Vref1, and if R>Rref then V1>Vref1. Alternatively expressed, if V1=Vref then R=Rref. If V1<Vref then R<Rref, and if V1>Vref then R>Rref.

Because transistor 223 can act as a current mirror for current I4 when the voltage level at the gate of transistors 241 and 223 are the same, if V1, the voltage level at the gate of transistor 223, equals to Vref1, the voltage level at the gate of transistor 241, then I3=I4 or I3=I2 because I2 is a mirrored current of I5, which is a mirrored current of I4. If V1 increases such that V1>Vref (or R>Rref) then I3 decreases or I3<I2 because I2 remains unchanged as Vref2 remains unchanged. Similarly, if V1 decreases such that V1<Vref (or R<Rref) then I3>I2. Because when V1=Vref1 R=Rref, when V1>Vref R>Rref, and when V1<Vref R<Rref. Alternatively expressed, if R=Rref then I3=I2. If R>Rref then I3>I2, and if R<Rref then I3<I2.

Based on the above analysis, circuit 220 compares currents I3 and I2. If I3=I2 then R=Rref. If I3>I2 then R<Rref, and if I3<I2 then R>Rref. Depending on applications, R may be considered Low if R<Rref, and considered High if R>Rref. Similarly V1 may be considered a low when V1<Vref1 and considered a high when V1>Vref1. Because when R<Rref V1<Vref, if R is low then V1 is low and if R is high then V1 is high. Alternatively expressed, if V1 is low then R is low, and if V1 is high then R is high.

Inverter INV inverts the logic level of voltage V2 at the drain of transistor 223 and the drain of transistor 222 to output V3. If voltage V2 is Low then voltage V3 is High and if voltage V2 is High then voltage V3 is Low. As a result, if V1 is Low then V2 is High, and V3 is Low. If V1 is High then V2 is Low, and V3 is High. Alternatively expressed, if R is High then V3 is Low and if R is High then V3 is High. Or if V3 is Low then R is Low and if V3 is High then R is High. In effect, the logic state of resistor R, or of eFuse 214, is reflected on voltage V3. That is, if eFuse 214 is Low then V3 is Low, and if eFuse 214 is High then V3 is High, or if V3 is Low then eFuse 214 is Low, and if V3 is High then eFuse 214 is High. As a result, knowing the logic state of voltage V3 provides the logic state of eFuse resistance R. In an embodiment, voltage V3 is buffered out of the chip embodying circuit 200 to be used as appropriate.

Transistor 270 serves to provide a current I6 mirrored from current I4. Op Amp 280 buffers voltage Vref1 to line 281 so that this voltage Vref1 is measured, e.g., by the external voltage meter Mex. External current meter Iex measures current I6 based on which reference resistance Rref is calculated as Vref1/I6. Because I6=I4, Rref=Vref1/I4. In an embodiment, once voltage Vref1 is known (e.g., through Op Amp 280), the value of voltage Vref1 is provided to external current meter Iex to provide a better mirror of current I6 from current I4. This is because, for a better current mirror, it is desirable that the voltage at the drain of transistor 270 be similar to the voltage at the drain of transistor 241, which is Vref1.

Bit line leakage tracking circuit 250 is used to compensate for the current leakage from bit line BL2. Circuit 250 is an imitation of (e.g., compatible with) circuit 210 without an eFuse 214. Transistors 251 and 252 correspond to transistors 215 and 216. Circuit 250, however, does not include a component corresponding to eFuse 214 because this resistance of this eFuse 214, in an embodiment, is insignificant as compared to that of transistor 252. If there is any leakage current associated with bit line BL2 (e.g., through the drain of transistor 216), current I1 would be affected (e.g., increases in the embodiment of FIG. 2). Because currents I4 and I1 are mirrored, circuit 250 provides a current path for the change (e.g., increase) in current I1 to be reflected on current I4, resulting in compensation.

Exemplary Methods

Figure 3:
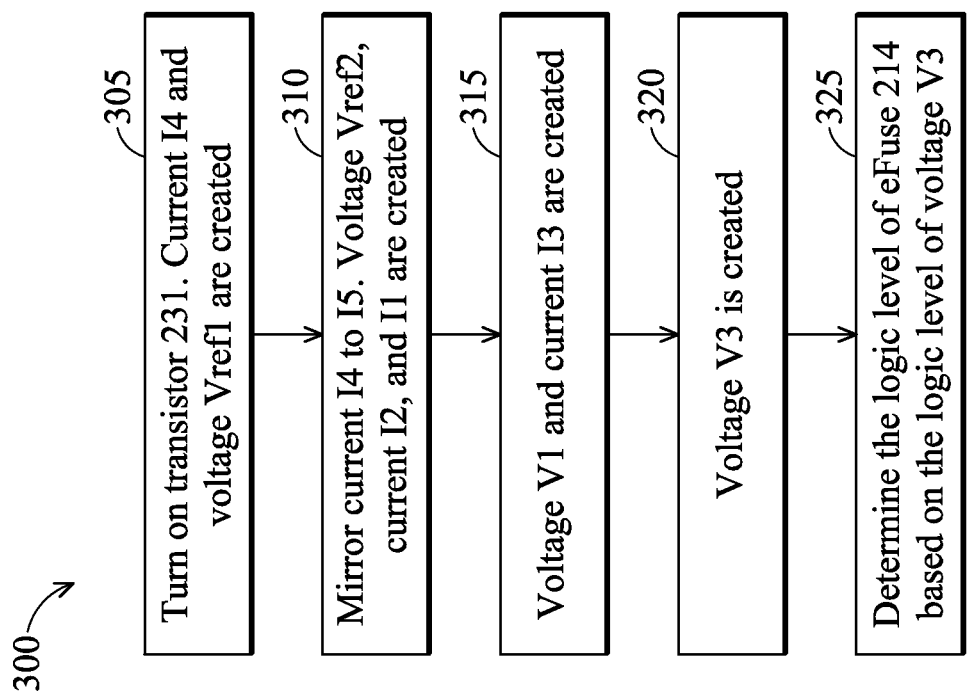
FIG. 3 is a flow chart illustrating a method of operation from the circuit of FIG. 2.

FIG. 3 is a flowchart 300 illustrating a method of operating circuit 100, in accordance with some embodiments.

In step 305, voltage Vref is applied to turn on transistor 231. As a result, current I4 flows, and voltage Vref1 is created.

In step 310, transistor 242 mirrors current I4 to current I5. Voltage Vref2 is therefore created, which turns on transistor 222 and generates current I2. At the same time, voltage Vref1 turns on transistor 221 and generates current I1.

In step 315, voltage V1 is created based on current I1 and the resistance of transistor 216, eFuse 214, and transistor 215, which turns on transistor 223 and generates current I3.

In step 320, inverter INV generates voltage V3 based on currents I2 and I3.

In step 325, the logic level of eFuse 214 is determined based on the logic level of voltage V3.

FIG. 4 is a flowchart 400 illustrating a method for determining (e.g., measuring) resistance R of eFuse 214, in accordance with some embodiments.

In step 405, based on a first voltage Vref (e.g., voltage Vref(1)) and thus a first value of reference resistance Rref (e.g., resistance Rref(1)), the first logic state of eFuse 214 (e.g., logic state State (1)) is determined. For illustration, logic State(1) is High indicating that resistance R of eFuse 214 is higher than resistance Rref(1).

In step 410, voltage Vref is adjusted to a new value, e.g., voltage Vref(2). Based on voltage Vref(2) and thus a new resistance Rref(2), a new logic state State(2) is obtained. For illustration purposes, logic state State(2) is Low indicating that resistance R is lower than resistance Rref(1).

In step 415, it is determined whether resistance R is equal to resistance Rref. That is, whether Rref(2)<R<Rref(1) where Rref(1) is substantially the same as Rref(2). If resistance R is not equal to resistance Rref, then steps 405 and 410 are repeated with one or more values of voltage Vref and thus resistances Rref until Vref(i)<R<Rref(j) where Rref(i) and Rref(j) are substantially equal. In effect R=Rref(i)=Rref(j), or stated another way, R=Rref. The flowchart then ends in step 420.

In the above illustration, there are various mechanisms to adjust voltage Vref and thus resistance Rref, including, for example, using a binary search or linear search method. Embodiments of the disclosures, however, are not limited to any method of adjusting Vref and/or Rref to obtain a resistance R.

In accordance with one embodiment, a method includes applying an input voltage external to a semiconductor chip to a first circuit of the semiconductor chip to generate an output voltage external to the semiconductor chip. The first circuit is electrically coupled to a resistive device. A logic state of the resistive device is determined based on a logic state of the external output voltage.

In accordance with another embodiment, a method of measuring electrical resistance of a memory cell includes generating a first reference voltage and a second reference voltage based on an input reference voltage. A third reference voltage is generated based on the first reference voltage and electrical resistance of the memory cell. An output signal is generated based on the second reference voltage and the third reference voltage. A first value of the input reference voltage that causes the output signal to have a first logic value is identified. A second value of the input reference voltage that causes the output signal to have a second logic value is identified, and the second logic value is complementary to the first logic value. The electrical resistance of the memory cell is determined based on the first value and the second value of the input reference voltage.

In accordance with another embodiment, a method includes setting an input reference voltage to have a first voltage value. A first current is generated responsive to the input reference voltage. The first current is mirrored to generate a second current and to generate a first voltage. A second voltage is generated by applying the second current to a memory cell. A logic signal is generated based on the first voltage and the second voltage. An input reference voltage is set to have a second voltage value based on a logic level of the logic signal corresponding to the first voltage value.

A number of embodiments of the disclosure have been described. It will nevertheless be understood that various variations and/or modifications may be made without departing from the spirit and scope of the invention. For example, in the illustrative circuits, when a resistor is used, a resistive circuit, component, or device may be used to replace that resistor. Some transistors are shown to be N-type and some others are shown to be P-type, but the disclosure is not limited to such a configuration because selecting a transistor type (e.g., N-type, P-type) is a matter of design choice based on need, convenience, etc. Various embodiments of the disclosure are applicable in all variations and/or combinations of transistor types. Additionally, some signals are illustrated with a particular logic level to operate some transistors (e.g., activated high, deactivated low, etc.), but selecting such levels and transistors are also a matter of design choice, and embodiments of the disclosure are applicable in various design choices.

The above methods show exemplary steps, but they are not necessarily performed in the order shown. Steps may be added, replaced, changed order, and/or eliminated as appropriate, in accordance with the spirit and scope of the disclosed embodiments. Each claim of this document constitutes a separate embodiment, and embodiments that combine different claims and/or different embodiments are within the scope of the disclosed embodiments and will be apparent to those of ordinary skill in the art after reviewing this document.

What is claimed is:

1. A method comprising:
    sequentially applying a first value and a second value, the second value being different from the first value, of an input voltage external to a semiconductor chip to a first circuit of the semiconductor chip to generate, for each of the first value and the second value of the external input voltage, an output voltage external to the semiconductor chip, the first circuit electrically coupled to a resistive device; and, for each of the first value and the second value of the external input voltage:
    using the external input voltage to generate a first current;
    mirroring the first current to a second current;
    generating the external output voltage based on the second current; and
    determining a logic state of the resistive device based on a logic state of the external output voltage.

2. The method of claim 1 further comprising, for each of the first value and the second value of the external input voltage:
    using the external input voltage to generate a voltage inside the semiconductor chip;
    passing the voltage and the second current generated inside the semiconductor chip to outside the semiconductor chip; and
    determining a reference resistance based on the voltage and the second current that are passed to outside the semiconductor chip.

3. The method of claim 2, further comprising:
    using the first value and the second value of the external input voltage to obtain a respective first value and second value of the reference resistance; and
    determining a first logic state and a second logic state of the resistive device based on the respective first value and second value of the reference resistance to obtain a resistance value of the resistive device.

4. The method of claim 1 wherein the resistive device is an electrical fuse of a memory cell.

5. The method of claim 1 further comprising, for each of the first value and the second value of the external input voltage, generating from the external input voltage a first voltage and a second voltage based on which the logic state of the external output voltage is determined.

6. The method of claim 5 further comprising, for each of the first value and the second value of the external input voltage:
    generating from the first voltage the second current flowing through the resistive device;
    generating from the second voltage a third current;
    generating from the second current and a resistance of the resistive device a third voltage that generates a fourth current; and
    determining the logic state of the external output voltage based on the third current and the fourth current.

7. The method of claim 1 further comprising, for each of the first value and the second value of the external input voltage:
    mirroring the first current to a third current; the second current flowing through a current path having the resistive device;
    mirroring the third current to a fourth current;
    using a voltage on the current path to generate a fifth current; and
    based on the fourth current and the fifth current, determining the logic state of the external output voltage.

8. The method of claim 1 further comprising using a second circuit to compensate for leakage current associated with the resistive device; the second circuit being coupled to the first circuit and compatible with a third circuit having the resistive device.

9. A method of measuring electrical resistance of a memory cell, comprising:
    generating a first reference voltage and a second reference voltage based on an input reference voltage;
    generating a third reference voltage based on the first reference voltage and electrical resistance of the memory cell; and
    generating an output signal based on the second reference voltage and the third reference voltage;
    identifying a first value of the input reference voltage that causes the output signal to have a first logic value;
    identifying a second value of the input reference voltage that causes the output signal to have a second logic value complementary to the first logic value; and
    determining the electrical resistance of the memory cell based on the first value and the second value of the input reference voltage.

10. The method of claim 9, wherein the identifying the first value and the identifying the second value are performed using a binary search method or a linear search method.

11. The method of claim 9, wherein the generating the first reference voltage comprises:
    adjusting a current based on the input reference voltage; and
    causing a current mirror to generate the first reference voltage responsive to the current.

12. The method of claim 9, wherein the generating the first reference voltage comprises:
    adjusting a current based on the input reference voltage; and causing a diode-connected transistor to generate the first reference voltage responsive to the current.

13. The method of claim 9, wherein the generating the second reference voltage comprises:
adjusting a current based on the input reference voltage; and
causing a diode-connected transistor to generate the second reference voltage responsive to the current.

14. The method of claim 9, wherein the generating the third reference voltage comprises:
generating a current responsive to the first reference voltage; and
causing the current to flow through the memory cell to generate the third reference voltage.

15. The method of claim 9, further comprising:
generating a current responsive to the first reference voltage; and
calculating an effective resistance based on measurement of the current and the first reference voltage.

16. A method comprising:
setting an input reference voltage to have a first voltage value;
generating a first current responsive to the input reference voltage;
mirroring the first current to generate a second current and to generate a first voltage;
generating a second voltage by applying the second current to a memory cell;
generating a logic signal based on the first voltage and the second voltage; and
setting the input reference voltage to have a second voltage value based on a logic level of the logic signal corresponding to the first voltage value.

17. The method of claim 16, wherein the setting the input reference voltage to have the first and second voltage values are performed using a binary search method or a linear search method.

18. The method of claim 16, wherein the generating the first current further comprises:
generating a leakage current component of the first current, the leakage current component of the first current is comparable to a leakage current of the memory cell.

19. The method of claim 16, wherein the mirroring the first current to generate the second current comprises:
causing a current mirror to generate the first voltage responsive to the first current; and
biasing a current source with the first voltage to generate the second current.

20. The method of claim 16, wherein the mirroring the first current to generate the first voltage comprises:
causing a diode-connected transistor to generate the first reference voltage responsive to the first current.

21. A method comprising:
sequentially applying a first value and a second value, the second value being different from the first value, of an input voltage external to a semiconductor chip to a first circuit of the semiconductor chip to generate, for each of the first value and the second value of the external input voltage, an output voltage external to the semiconductor chip, the first circuit electrically coupled to a resistive device; and, for each of the first value and the second value of the external input voltage:
using the external input voltage to generate a current; and
generating the external output voltage based on the current and on a logic state of the resistive device.

* * * * *